(12) United States Patent
Cleveland et al.

(10) Patent No.: US 8,692,530 B2
(45) Date of Patent: *Apr. 8, 2014

(54) EFFICIENCY-OPTIMIZING, CALIBRATED SENSORLESS POWER/ENERGY CONVERSION IN A SWITCH-MODE POWER SUPPLY

(75) Inventors: Terry Cleveland, Endicott, NY (US); Clifford Ellison, III, Campbell, NY (US); Scott Dearborn, Brackney, PA (US); Keith Pazul, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 350 days.

This patent is subject to a terminal disclaimer.

(21) Appl. No.: 13/158,874

(22) Filed: Jun. 13, 2011

(65) Prior Publication Data
US 2012/0133347 A1 May 31, 2012

Related U.S. Application Data

(60) Provisional application No. 61/418,183, filed on Nov. 30, 2010.

(51) Int. Cl.
*H02M 3/157* (2006.01)
(52) U.S. Cl.
USPC ............................................. 323/283
(58) Field of Classification Search
USPC .......... 323/224, 225, 282, 283, 284, 285, 351
See application file for complete search history.

(56) References Cited

U.S. PATENT DOCUMENTS

| | | | |
|---|---|---|---|
| 5,914,870 A | 6/1999 | Noble et al. | 363/84 |
| 5,955,872 A * | 9/1999 | Grimm | 323/283 |
| 5,959,443 A * | 9/1999 | Littlefield | 323/287 |
| 6,400,127 B1 | 6/2002 | Giannopoulos | 323/283 |
| 6,724,175 B1 | 4/2004 | Matsuda et al. | 323/283 |
| 7,436,158 B2 * | 10/2008 | Huang et al. | 323/224 |
| 7,463,011 B2 | 12/2008 | Sharma | 323/283 |

(Continued)

FOREIGN PATENT DOCUMENTS

WO 2005/079227 A2 9/2005

OTHER PUBLICATIONS

International PCT Search Report and Written Opinion, PCT/US2011/061599, 12 pages.

(Continued)

*Primary Examiner* — Gary L Laxton
(74) *Attorney, Agent, or Firm* — King & Spalding L.L.P.

(57) ABSTRACT

An intelligent pulse width modulation (PWM) controller adapts a switch mode power supply (SMPS) system's operating parameters to optimize efficiency, remove hot spots and isolate faults by integrating a microcontroller, PWM digital circuits and analog circuits into a single integrated circuit, e.g., a mixed signal device, thereby reducing the number of external connections, silicon die area and integrated circuit packages. A lossless inductor current sense technique integrates a matched, tunable complimentary filter with the intelligent SMPS controller for accurately measuring current through the power inductor of the SMPS without introducing losses in the power circuit. The complimentary filter is adjusted by the microcontroller to significantly reduce the effects of component tolerances, accurately measuring the power inductor current for precise closed loop control and over current protection. The frequency pole and gain of the complimentary integrated filter can be adjusted on the fly in order to adapt to dynamically changing operating conditions of the SMPS system.

17 Claims, 7 Drawing Sheets

(56) References Cited

U.S. PATENT DOCUMENTS

| | | | |
|---|---|---|---|
| 7,592,791 B2 | 9/2009 | Emira | 323/283 |
| 7,719,251 B2 | 5/2010 | Qahouq et al. | 323/286 |
| 7,825,642 B1 | 11/2010 | Young et al. | 323/224 |
| 7,888,918 B2 * | 2/2011 | Wu et al. | 323/224 |
| 7,923,794 B2 | 4/2011 | Feyh | 257/415 |
| 7,948,720 B2 | 5/2011 | Mok et al. | 361/18 |
| 8,120,335 B2 * | 2/2012 | Caldwell | 323/224 |
| 8,179,105 B2 * | 5/2012 | Lipcsei | 323/224 |
| 8,344,712 B2 | 1/2013 | Martin et al. | 323/272 |
| 2002/0144163 A1 | 10/2002 | Goodfellow et al. | 713/300 |
| 2004/0046535 A1 | 3/2004 | Duffy et al. | 323/283 |
| 2004/0232898 A1 | 11/2004 | Morris et al. | 323/282 |
| 2007/0236281 A1 | 10/2007 | Cicalini | 327/553 |
| 2007/0236287 A1 | 10/2007 | Bernacchia et al. | 330/10 |
| 2007/0262802 A1 | 11/2007 | Huard et al. | 327/172 |
| 2008/0284388 A1 | 11/2008 | Oettinger et al. | 323/234 |
| 2009/0096533 A1 | 4/2009 | Paul et al. | 330/305 |
| 2009/0146634 A1 | 6/2009 | Audy | 323/290 |
| 2010/0079127 A1 | 4/2010 | Grant | 323/285 |

OTHER PUBLICATIONS

International PCT Search Report and Written Opinion, PCT/US2011/062786, 11 pages.

International PCT Search Report and Written Opinion, PCT/US2011/062784, 11 pages.

* cited by examiner

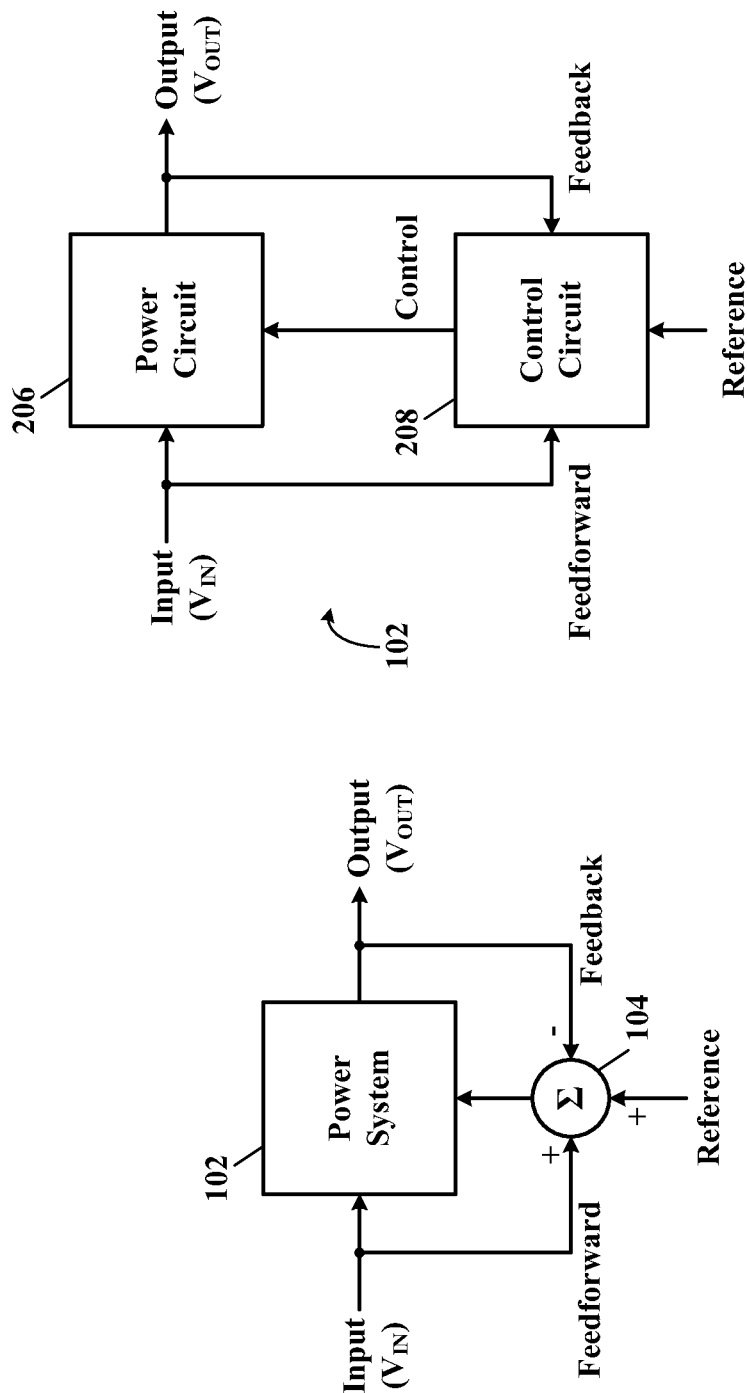

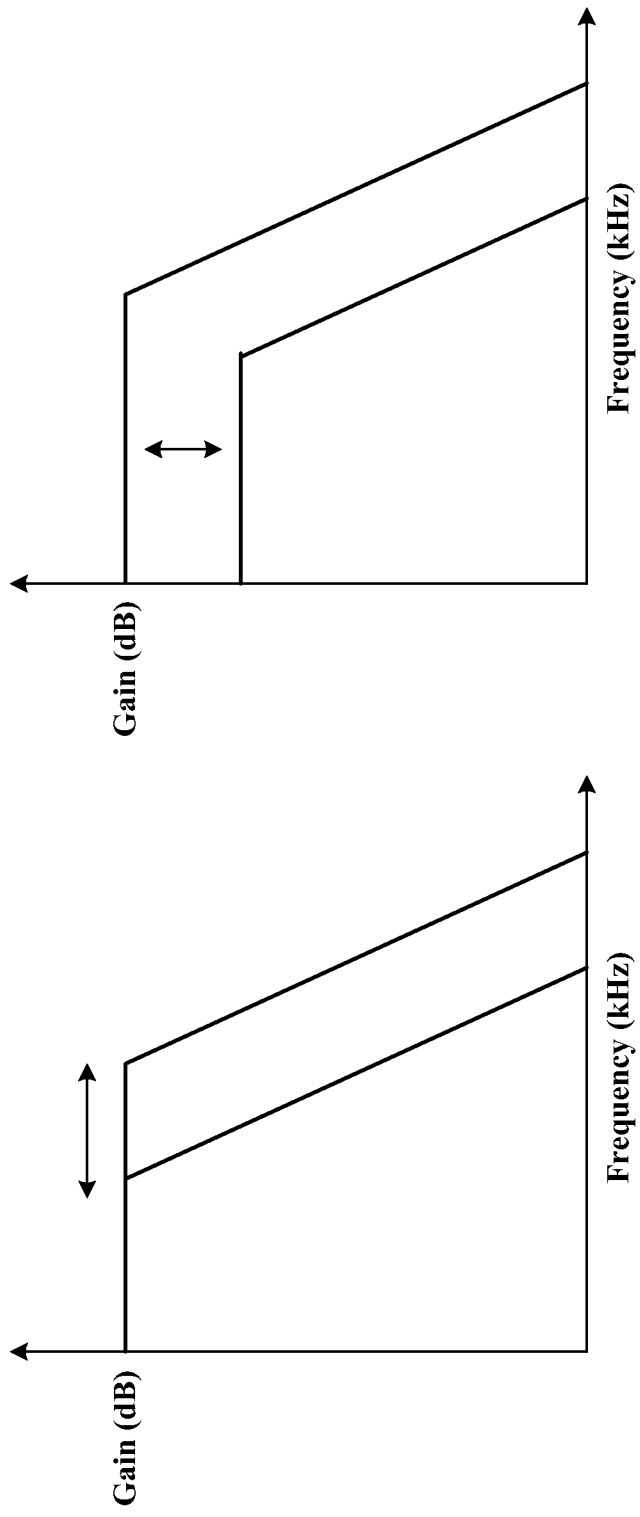

EFFICIENCY-OPTIMIZING, CALIBRATED SENSORLESS POWER/ENERGY CONVERSION IN A SWITCH-MODE POWER SUPPLY

RELATED PATENT APPLICATIONS

This application claims priority to commonly owned U.S. Provisional Patent Application Ser. No. 61/418,183; filed Nov. 30, 2010; U.S. patent application Ser. No. 13/159,000; filed Jun. 13, 2011; and U.S. patent application Ser. No. 13/159,090; filed Jun. 13, 2011; all of which are hereby incorporated by reference herein for all purposes.

TECHNICAL FIELD

The present disclosure relates to switch mode power supplies, and, more particularly, to efficiency-optimizing, calibrated sensorless power/energy conversion in a switch-mode power supply (SMPS).

BACKGROUND

The synchronous buck switch-mode power converter is a commonly used topology for switch-mode power supply (SMPS) applications. The SMPS topology is gaining wider acceptance because of its high efficiency, small size and light weight. However, as the size of an SMPS is decreased, heat dissipation/removal therefrom becomes more problematic. Even though the typical efficiency of an SMPS may be 90 percent, there still remains 10 percent of the energy used by the SMPS becoming wasted heat. In addition, the high efficiency of the SMPS is optimized for only a single load condition. However, in real world applications power utilization loads vary over a wide range, and so do the associated SMPS efficiencies at those loads. Current sensing in the SMPS topology can be challenging and must be overcome in design. Knowing or monitoring the current being injected into the load provides protection for the power converter and can improve dynamic performance during closed loop control thereof.

Inductors in the SMPS are used to store energy during a portion of the switching cycle. The electrical characteristics, e.g., inductance and magnetic saturation values, of the SMPS inductor may vary widely. The tolerance of the inductor characteristics varies with temperature and/or voltage, so SMPS systems must be "over-designed" to optimize SMPS system efficiency for worst case conditions. Also, accurate measurement of the inductor current from one SMPS to another and at different load currents becomes problematic. Having the ability to accurately calibrate inductor current sense circuits associated with the inductors of a multiphase SMPS system would improve the dynamic performance and eliminate hot spots for the multiple phase converters of the multiphase SMPS system.

SUMMARY

Therefore a need exists for a higher performance power/energy conversion switch-mode power supply (SMPS) that maintains improved efficiencies for substantially all load conditions. This may be accomplished with an intelligent pulse width modulation (PWM) controller that adapts the SMPS system operating parameters to optimize efficiency, remove hot spots and isolate faults by integrating a microcontroller, PWM digital circuits and analog circuits into a single integrated circuit, thereby reducing the number of external connections, silicon die area and integrated circuit packages then have been required by prior technology SMPS systems. Thereby allowing smaller printed circuit board space and fewer external components that result in lower cost to manufacture and improved reliability of the SMPS system.

These improved efficiencies available for substantially all load conditions may be achieved by combining intelligent control and the use of pulse width modulation (PWM) with calibrated sensorless feedback techniques more fully described hereinafter. According to the teachings of this disclosure, the intelligent SMPS controller may be programmed to optimize SMPS efficiencies for all operating parameters, e.g., switching frequencies, delay time between switches, drive capabilities, etc., over substantially all load conditions of the SMPS.

According to a specific example embodiment of this disclosure, a switch-mode power supply (SMPS) comprises: at least one power switch coupled to a voltage source; a power inductor coupled to the at least one power switch; a filter capacitor coupled to a load side of the power inductor that provides a regulated voltage output of the SMPS; and a SMPS controller coupled to the voltage source, the at least one power switch, the power inductor and the regulated voltage output of the SMPS, wherein the SMPS controller comprises: at least one driver coupled to the at least one power switch; a pulse width modulation (PWM) generator having an output coupled to and controlling the at least one driver; a digital processor having a memory, the digital processor is coupled to and provides operating parameters to the PWM generator during operation thereof; a voltage comparison circuit for comparing the regulated output voltage to a reference voltage, wherein the voltage comparison circuit generates an error signal representative of a difference between the regulated output voltage and the reference voltage, and wherein the error signal is coupled to an error input of the PWM generator; and a sensorless tunable complimentary filter coupled to the power inductor, wherein the sensorless tunable complimentary filter measures current through the power inductor and provides a voltage output to the digital processor that is representative of the current flowing through the power inductor; wherein the digital processor optimizes operation of the SMPS by providing operating parameters to the SMPS controller for all operating conditions of the SMPS.

According to another specific example embodiment of this disclosure, a method for optimizing operation of a switch-mode power supply (SMPS), said method comprises the steps of: providing at least one power switch coupled to a voltage source; providing a power inductor coupled to the at least one power switch; providing a filter capacitor coupled to a load side of the power inductor that provides a regulated voltage from the SMPS; and providing a SMPS controller, wherein the SMPS controller facilitates: coupling at least one driver to the at least one power switch, controlling the at least one driver with a pulse width modulation (PWM) generator, comparing the regulated voltage from the SMPS to a reference voltage with a voltage comparison circuit, generating a voltage error signal representative of a difference between the regulated voltage and the reference voltage with the voltage comparison circuit, coupling the voltage error signal to the PWM generator, measuring current through the power inductor with a sensorless tunable complimentary filter coupled to the power inductor; providing a current output signal representative of the current flowing through the power inductor with the sensorless tunable complimentary filter, providing a digital processor having a memory, wherein the voltage error signal and the current output signal are coupled to inputs of the digital processor and the digital processor controls the PWM generator for adjusting operating parameters based upon the current output and voltage error signals.

BRIEF DESCRIPTION OF THE DRAWINGS

A more complete understanding of the present disclosure thereof may be acquired by referring to the following description taken in conjunction with the accompanying drawings wherein:

FIG. 1 illustrates a schematic block diagram of a basic voltage regulator system;

FIG. 2 illustrates a more detailed schematic block diagram of the voltage regulator system shown in FIG. 1;

FIG. 7 illustrates a graph of pole frequency adjustments for the circuits shown in FIGS. 5 and 6;

FIG. 8 illustrates a graph of DC gain adjustments for the circuits shown in FIGS. 5 and 6.

Figure 3:
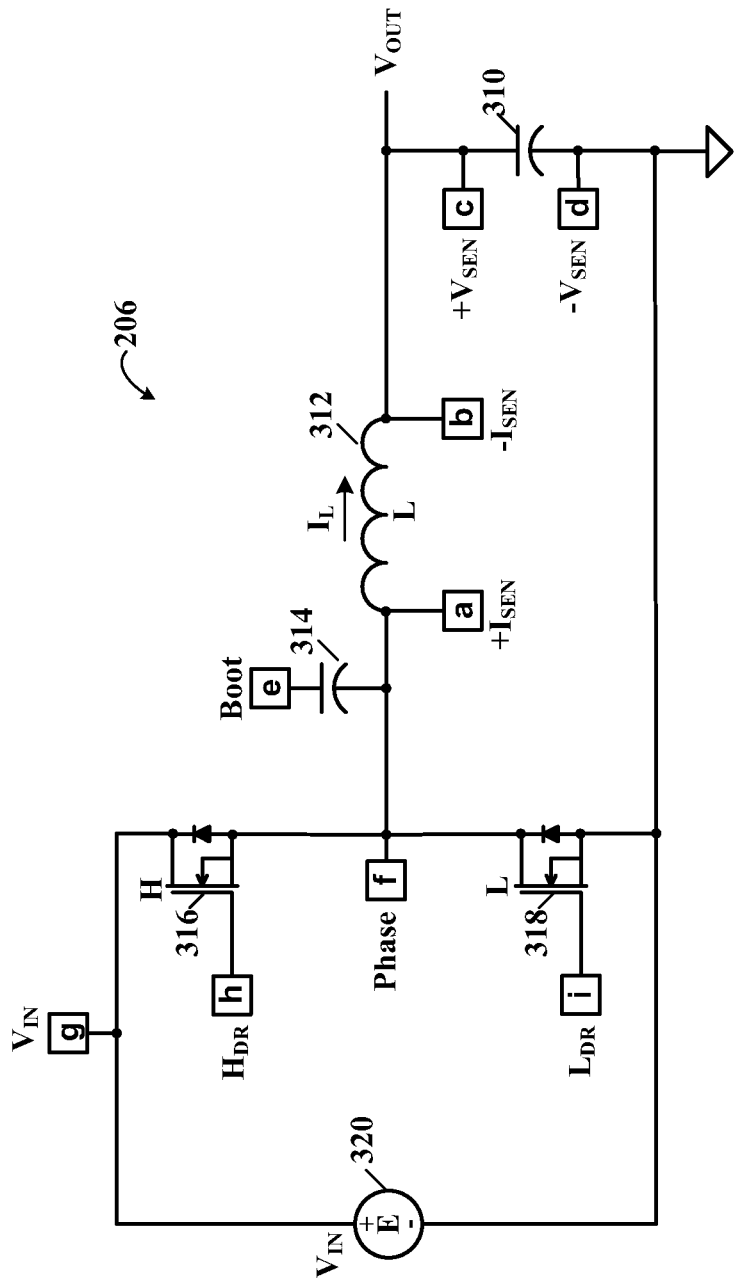
FIG. 3 illustrates a schematic diagram of the power circuit shown in FIG. 2 implemented as a switch-mode power supply (SMPS), according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

In a general sense, a power converter can be defined as a device which converts one form of energy into another on a continuous basis. Any storage or loss of energy within such a power system while it is performing its conversion function is usually identical to the process of energy translation. There are many types of devices which can provide such a function with varying degrees of cost, reliability, complexity, and efficiency.

The mechanisms for power conversion can take many basic forms, such as those which are mechanical, electrical, or chemical processing in nature. The focus herein will be on power converters which perform energy translation electrically and in a dynamic fashion, employing a restricted set of components which include inductors, capacitors, transformers, switches and resistors. How these circuit components are connected is determined by the desired power translation. Resistors introduce undesirable power loss. Since high efficiency is usually an overriding requirement in most applications, resistive circuit elements should be avoided or minimized in a main power control path. Only on rare occasions and for very specific reasons are power consuming resistances introduced into the main power control path. In auxiliary circuits, such as sequence, monitor, and control electronics of total system, high value resistors are common place, since their loss contributions are usually insignificant.

Referring to FIG. 1, depicted is a schematic block diagram of a basic voltage regulator system. A power system 102, e.g., a basic switch-mode power converter where an input of an uncontrolled source of voltage (or current, or power) is applied to the input of the power system 102 with the expectation that the voltage (or current, or power) at the output will be very well controlled. The basis of controlling the output is to compare it to some form of reference, and any deviation between the output and the reference becomes an error. In a feedback-controlled system, negative feedback is used to reduce this error to an acceptable value, as close to zero as is required by the system. It is desirable, typically, to reduce the error quickly, but inherent with feedback control is the tradeoff between system response and system stability. The more responsive the feedback network is, the greater becomes the risk of instability.

At this point, it should be mentioned that there is another method of control—feed forward. With feed forward control, a control signal is developed directly in response to an input variation or perturbation. Feed forward is less accurate than feedback since output sensing is not involved, however, there is no delay waiting for an output error signal to be developed, and feed forward control cannot cause instability. It should be clear that feed forward control typically is not adequate as the only control method for a voltage regulator, but it is often used together with feedback to improve a regulator's response to dynamic input variations.

Referring to FIG. 2, depicted is a more detailed schematic block diagram of the voltage regulator system shown in FIG. 1. The power system 102 has been separated into two blocks: the power circuit 206 and the control circuit 208. The power circuit 206 handles the power system load current and is typically large, robust, and subject to wide temperature fluctuations. Its switching functions are by definition, large-signal phenomenon, normally simulated in most stability analyses as just a two-state switch with a duty cycle. The output filter (not shown) is also considered as a part of the power circuit 206, but can be considered as a linear block. The control circuit 208 will normally be made up of a gain block, an error amplifier, and a pulse-width modulator, used to define the duty cycle for the power switches. According to the teachings of this disclosure, the control circuit 208 is optimized to respond to disturbances in the power system 102 while maintaining a desired output voltage, $V_{OUT}$.

Referring to FIG. 3, depicted is a schematic diagram of the power circuit shown in FIG. 2 implemented as a switch-mode power supply (SMPS), according to a specific example embodiment of this disclosure. The power circuit 206 of the SMPS may comprise a power source 320, e.g., battery, a power inductor 312, high and low switches 316 and 318, respectively, e.g., power field effect transistors; a load capacitor 310 for smoothing alternating current (AC) ripple from the desired direct current (DC) output, and a boot voltage capacitor 314. The power circuit 206 is connected to and controlled by the control circuit 208 as shown in FIG. 4 and more fully described hereinafter.

Figure 4:
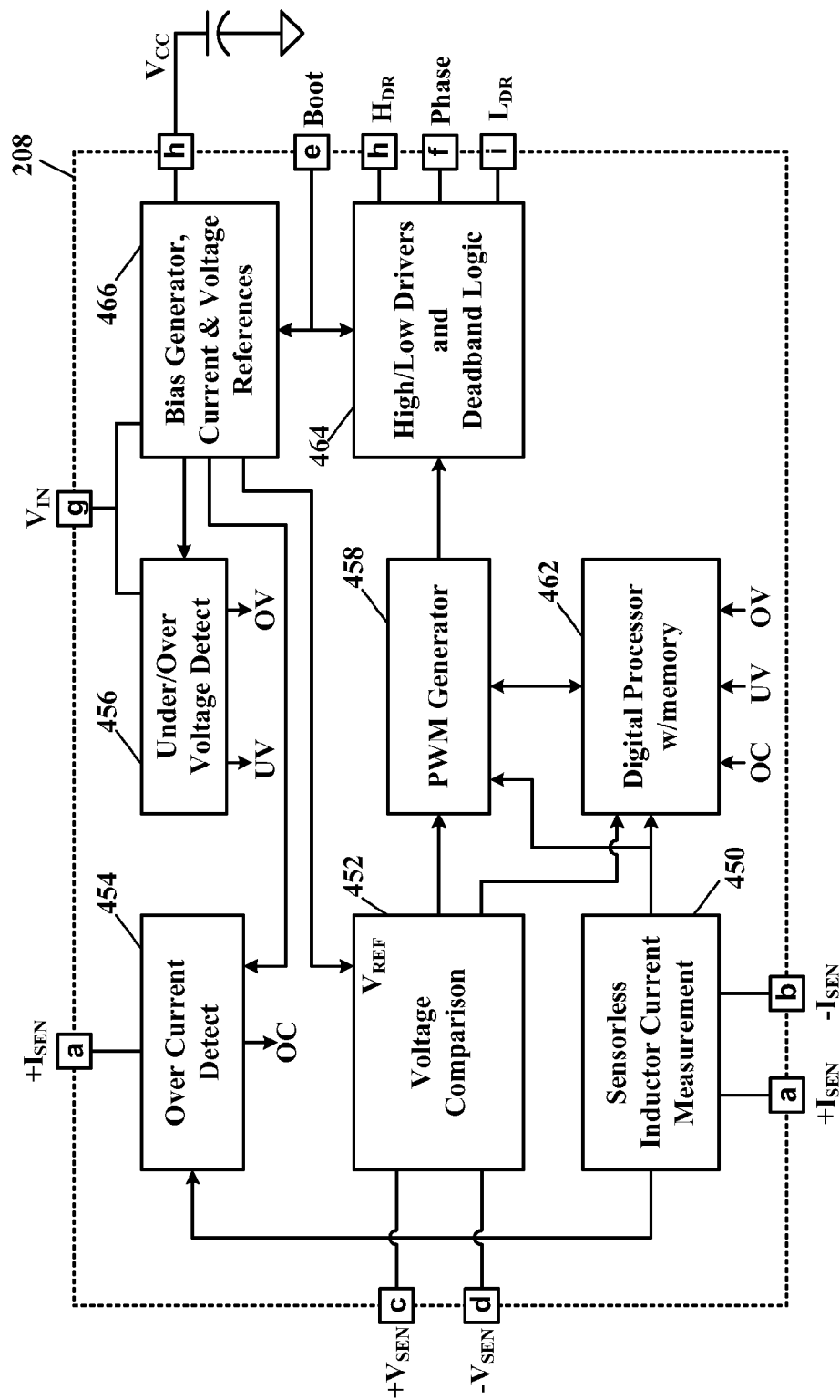
FIG. 4 illustrates a more detailed schematic block diagram of the control circuit shown in FIG. 2, according to the specific example embodiment of this disclosure.

Referring to FIG. 4, depicted is a more detailed schematic block diagram of the control circuit shown in FIG. 2, according to the specific example embodiment of this disclosure. The control circuit 208 is connected to the power circuit 206 shown in FIG. 3 and comprises a digital processor with memory 462, e.g., microcontroller; high and low switch drivers having deadband logic represented by function block 464, bias generator, current and voltage reference circuits 466; under and over voltage detectors 456, a PWM generator 458, an over current detector 454, a voltage comparison circuit 452, and a sensorless inductor current measurement circuit 450. The PWM generator 458 may be of either an analog or digital design for supplying PWM control pulses to the high and low switch drivers 464.

The high and low switch drivers of the function block 464 are coupled to and control when the high and low switches 316 and 318 turn on and off. In addition the deadband logic of the function block 464 prevent the high and low switches 316 and 318 from ever being on at the same time, preferably, there is a deadband where both of the high and low switches 316 and 318 are off. The PWM generator 458 controls when and for how long the power inductor 312 is coupled to and being charged by the power source 320.

The boot voltage capacitor 314 supplies power to the high side portion of the switch driver 464; and the bias generator, current and voltage reference circuits 466. The bias generator, current and voltage reference circuits 466 supply precision current and voltage reference values to the current and voltage circuits 452, 454 and 456. The voltage comparison circuit 452 measures the output voltage and compares it to a reference voltage, $V_{REF}$, from the voltage reference circuit 466. An error signal from the voltage comparison circuit 452, representing the difference between a desired voltage value and the actual output voltage value, is applied to an error input of the PWM generator 458, wherein the PWM generator 458 adjusts its pulse waveform output to minimize that difference (closed loop feedback, see FIG. 1). The over current detector 454 monitors the current to the power inductor 312, and the under and over voltage detectors 456 monitor the input voltage to the SMPS for undesirable e.g., abnormal, conditions, e.g., inductor current exceeds allowable design limits, input voltage is above or below a design operating input voltage range. The sensorless inductor current measurement circuit 450 losslessly measures SMPS power inductor current, as shown in FIGS. 5 and 6 and more fully described hereinafter.

Figure 5:
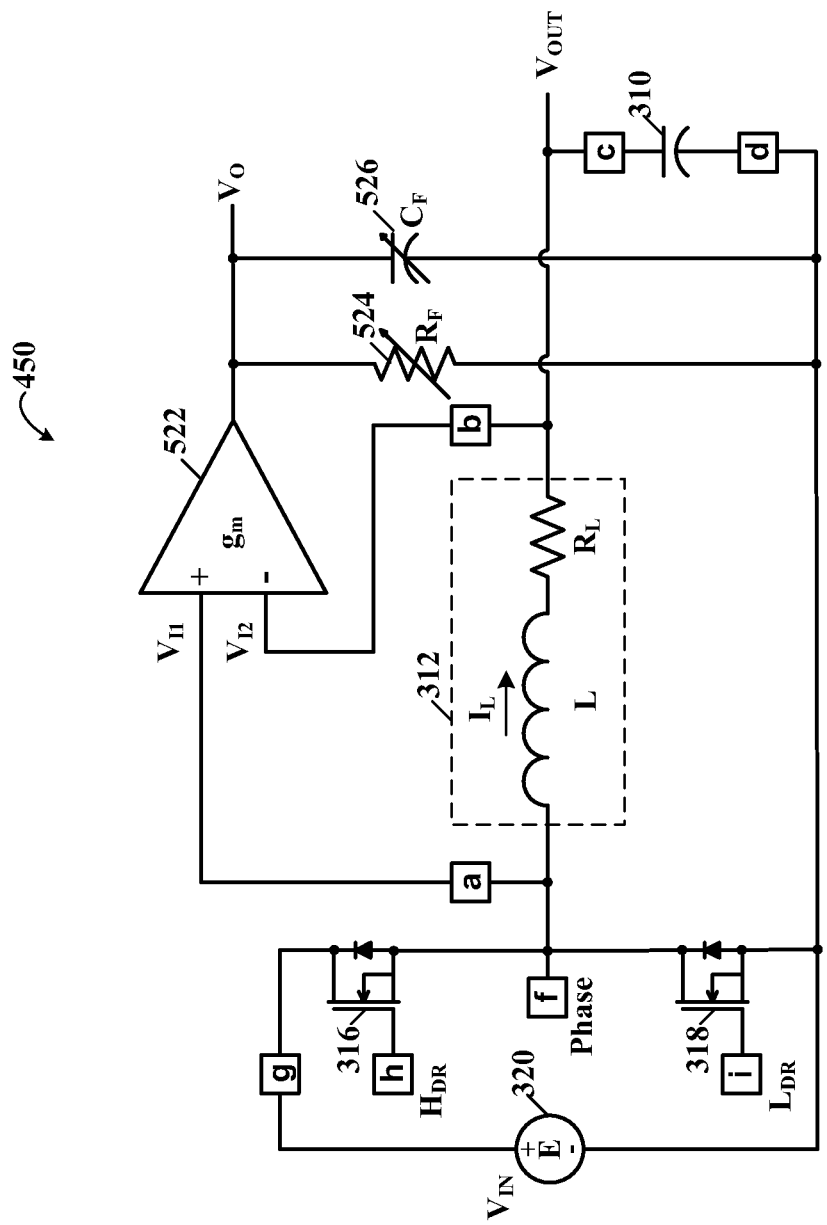
FIG. 5 illustrates a schematic diagram of a circuit for losslessly measuring inductor current of a SMPS, according to a specific example embodiment of this disclosure.
Figure 6:
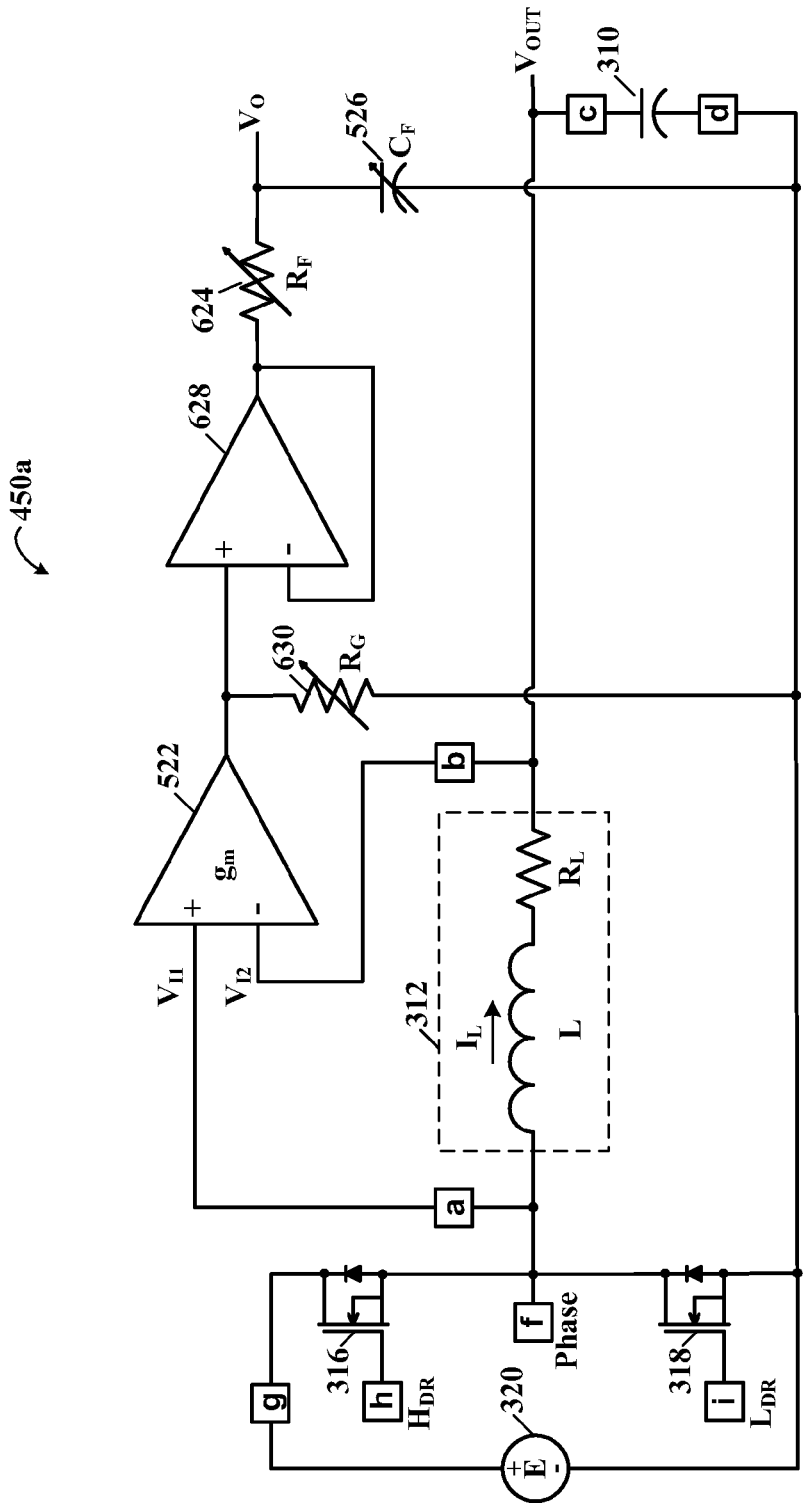
FIG. 6 illustrates a schematic diagram of a circuit for losslessly measuring inductor current of a SMPS, according to another specific example embodiment of this disclosure.

The sensorless inductor current measurement circuit 450 may be implemented as a matched complimentary filter by utilizing a tunable filter comprising an operational transconductance amplifier (OTA), a variable resistor and a variable capacitor in one specific example embodiment (FIG. 5). In another specific example embodiment, an operational amplifier, configured as a buffer, and a variable resistor have been added, providing independent gain and pole location adjustment (FIG. 6).

Referring to FIG. 5, depicted is a schematic diagram of a circuit for losslessly measuring the power inductor current of the SMPS, according to a specific example embodiment of this disclosure. A tunable complimentary filter inductor current measuring circuit comprises an operational transconductance amplifier (OTA) 522, a variable resistor 524, and a variable capacitor 526. The OTA 522 is configured as a voltage variable integrator and is used as a first-order low-pass filter (see FIGS. 7 and 8). The transfer function for this integrator is:

$$V_O/(V_{11}-V_{12})=g_m/(s^*C_F)$$

The OTA 522 circuit shown in FIG. 5 has an adjustable pole frequency, and adjustable DC gain. The pole frequency is adjusted by the capacitor 526, $C_F$, and resistor 524, $R_F$; and the DC gain is adjusted by the resistor 524, $R_F$. The transfer function of the filter shown in FIG. 5 is represented by:

$$V_O/(V_{11}-V_{12})=(g_m R_F)/(s^*R_F^*C_F+1)$$

As noted from the transfer function, the DC gain is equal to $g_m^*R_F$; and the pole frequency is equal to $1/(2\pi^*R_F^*C_F)$ Hz. The pole frequency and DC gain can not be adjusted independently.

Referring to FIG. 6, depicted is a schematic diagram of a circuit for losslessly measuring the power inductor current of the SMPS, according to another specific example embodiment of this disclosure. A tunable complimentary filter inductor current measuring circuit comprises an operational transconductance amplifier (OTA) 522, a variable resistor 624, an operational amplifier 628 configured as a buffer, a variable resistor 630, and a variable capacitor 526. The OTA 522 is configured as a voltage variable input gain stage with a wide bandwidth. The operational amplifier 628 decouples the input gain stage from the single pole, low pass filter. The pole frequency can be adjusted by changing the resistor 624, $R_F$, and/or the capacitor 526, $C_F$, and the DC gain can be subsequently adjusted by changing the variable resistor 630, $R_G$. The transfer function of the filter shown in FIG. 6 is represented by:

$$V_O/(V_{11}-V_{12})=(g_m^*R_G)/(s^*R_F^*C_F+1)$$

As noted from the transfer function, the DC gain is equal to $g_m^*R_G$; and the pole frequency is equal to $1/(2\pi^*R_F^*C_F)$ Hz. The pole frequency and DC gain can be adjusted independently.

The tunable complimentary filters shown in FIGS. 5 and 6 can be adjusted, e.g., tuned, to match the $L/R_L$ zero, and gain adjusted to amplify the sensed current signal to a desired voltage level. The tunable complimentary filters can further be adjusted in-circuit to significantly reduce the effects of component tolerances. The tunable complimentary filters can be adjusted on the fly in order to adapt to changing operating conditions of the SMPS. The tunable complimentary filters may be used to accurately measure the current through the power inductor 312 for precise closed loop control of the SMPS over all operating conditions so that the SMPS efficiency can be maximized by the digital processor 462 through the PWM generator 458. The sensorless inductor current measurement circuit 450 described hereinabove may also be used to monitor over current through the power inductor, thus taking the place of an eliminating the separate over current detector 454.

The lossless current measurement circuits shown in FIGS. 5 and 6, accurately measure current through the SMPS power inductor 312 without wasting power, are highly accurate over all operating conditions, and are flexible and low in cost to implement in a mixed signal integrated circuit 208 (FIG. 4).

Referring to FIG. 7, depicted is a graph of pole frequency adjustments for the circuits shown in FIGS. 5 and 6.

Referring to FIG. 8, depicted is a graph of DC gain adjustments for the circuits shown in FIGS. 5 and 6.

Figure 9:
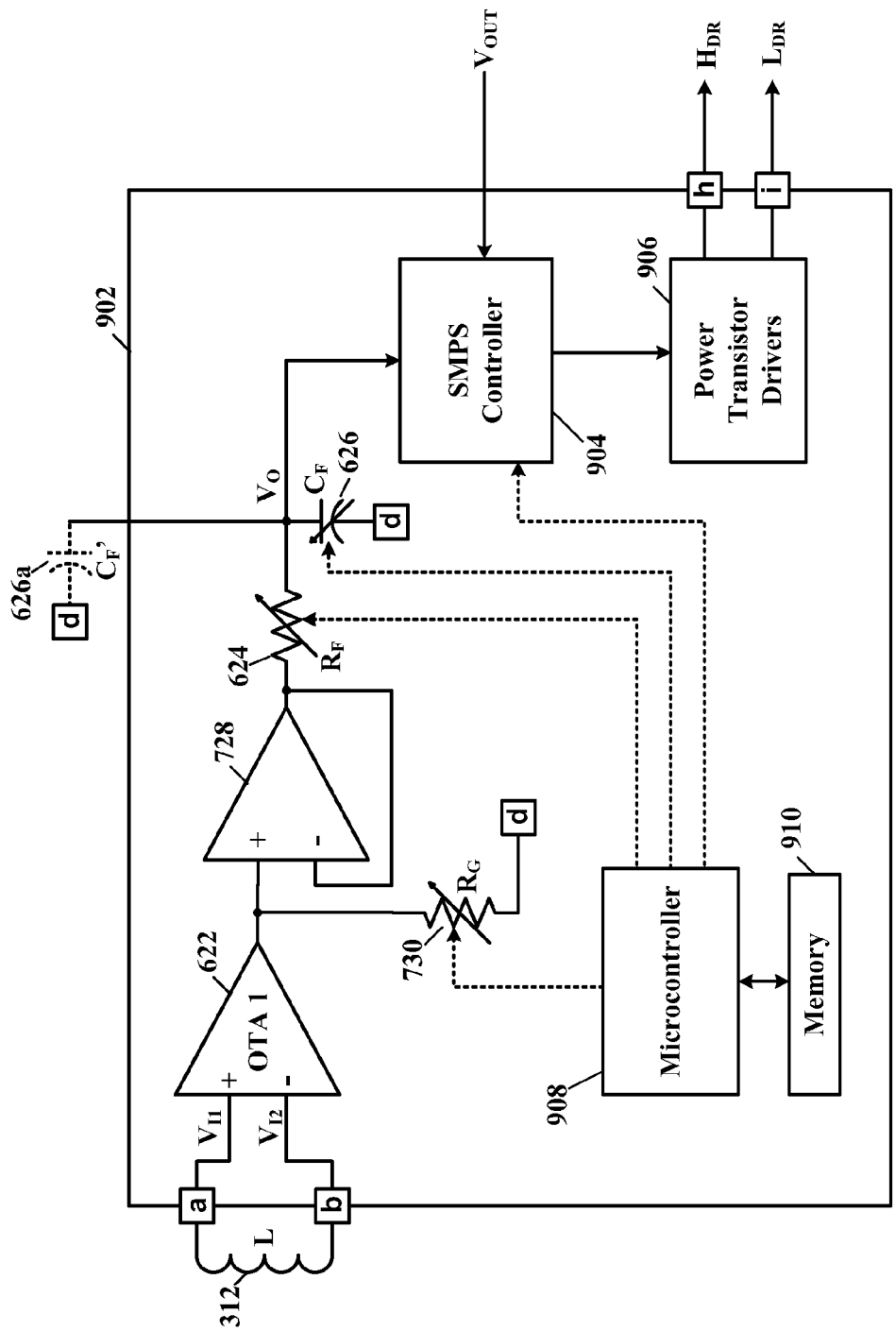
FIG. 9 illustrates a schematic block diagram of a mixed signal integrated circuit device for controlling a SMPS system using the specific example embodiments of the tunable complimentary filters shown in FIGS. 5 and 6.

Referring to FIG. 9, depicted is a schematic block diagram of a mixed signal integrated circuit device for controlling a SMPS system using the specific example embodiments of the tunable complimentary filters shown in FIGS. 5 and 6. The mixed signal integrated circuit device 902 (e.g., in an integrated circuit package having external electrical connections) comprises a SMPS controller 904, power transistor drivers 906 (e.g., function block 464 of FIG. 4), a microcontroller 908 (e.g., digital processor) and associated memory 910 (may be part of the microcontroller 908), an OTA 622, an operational amplifier 728, a DC gain setting resistor 730, a pole frequency setting resistor 624, and a pole frequency setting capacitor 626. The SMPS controller 904 may generate a pulse width modulation (PWM), pulse frequency modulation (PFM), pulse density modulation (PDM), etc., signal for controlling the power transistor drivers 906 that provide the power control signals to the power MOSFET switches 316 and 318 of the SMPS. The SMPS controller 904 monitors the voltage regulated output voltage, $V_{OUT}$, and the measured inductor current signal, $V_O$, from the tunable complimentary filter comprising OTA 622, operational amplifier 728, variable resistors 624 and 730, and tuning capacitor 626.

The OTA 622, operational amplifier 728, variable resistors 624 and 730, and tuning capacitor 626 are connected and operate as more fully described hereinabove. The microcontroller 908 may control the variable resistors 624 and 730, as well as setting parameters for the SMPS controller 904 (dotted lines represent control signals). It is contemplated and within the scope of this disclosure that the microcontroller 908 can perform the same functions as and replace the SMPS controller 904. The microcontroller 908 has analog inputs and analog-to-digital conversion circuits (not shown). An operating program for the mixed signal integrated circuit device 902 may be stored in the memory 910 associated with the microcontroller 908. An additional capacitor 626a may be added external to the mixed signal integrated circuit device 902 and in parallel with the internal capacitor 626. The microcontroller 908 may control the capacitance value of the capacitor 626, and in combination with control of the variable resistors 624 and 730. Control of the capacitor 626 and/or variable resistors 624 and 730 by the microcontroller 908 allows dynamic tuning of the gain and/or pole frequency of the tunable complementary filter complimentary filter on the fly for optimal current measurement under changing operating conditions of the SMPS. The tunable complimentary filter implementation(s), according to the teachings of this disclosure can also be applied, but is not limited to, switch-mode power converters (e.g., SMPS), brushless dc motors, etc.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A switch-mode power supply (SMPS), said SMPS comprising:
   at least one power switch coupled to a voltage source;
   a power inductor coupled to the at least one power switch;
   a filter capacitor coupled to a load side of the power inductor that provides a regulated voltage output of the SMPS; and
   a SMPS controller coupled to the voltage source, the at least one power switch, the power inductor and the regulated voltage output of the SMPS, wherein the SMPS controller comprises:
   at least one driver coupled to the at least one power switch;
   a pulse width modulation (PWM) generator having an output coupled to and controlling the at least one driver;
   a digital processor having a memory, the digital processor is coupled to and provides operating parameters to the PWM generator during operation thereof;
   a voltage comparison circuit for comparing the regulated output voltage to a reference voltage, wherein the voltage comparison circuit generates an error signal representative of a difference between the regulated output voltage and the reference voltage, and wherein the error signal is coupled to an error input of the PWM generator; and
   a sensorless tunable complimentary filter coupled to the power inductor, wherein the sensorless tunable complimentary filter measures current through the power inductor and provides a voltage output to the digital processor that is representative of the current flowing through the power inductor;
   wherein the digital processor optimizes operation of the SMPS by providing operating parameters to the SMPS controller for all operating conditions of the SMPS.

2. The SMPS according to claim 1, wherein the sensorless tunable complimentary filter, comprises:
   an operational transconductance amplifier (OTA) having a first input coupled to the power inductor at the at least one power switch side thereof, a second input coupled to a load side of the power inductor and a current output;
   an adjustable resistor coupled between the current output of the OTA and a return of the voltage source; and
   a tuning capacitor coupled between the current output of the OTA and the return of the voltage source;
   wherein the voltage output from the tunable complimentary filter is available at a common node of the current output of the OTA and the adjustable resistor.

3. The SMPS according to claim 2, wherein a pole frequency of the tunable complimentary filter is adjusted to match a zero frequency of the power inductor by changing a resistance of the adjustable resistor.

4. The SMPS according to claim 2, wherein a pole frequency of the tunable complimentary filter is adjusted to match a zero frequency of the power inductor by changing a capacitance of the tuning capacitor.

5. The SMPS according to claim 1, wherein the sensorless tunable complimentary filter, comprises:
   an operational transconductance amplifier (OTA) having a first input coupled to the power inductor at the at least one power switch side thereof, a second input coupled to a load side of the power inductor and a current output;
   an operational amplifier configured as a buffer amplifier and having an input coupled to the current output of the OTA;
   a first adjustable resistor coupled between the current output of the OTA and a return of the voltage source;
   a second adjustable resistor having a first end coupled to an output of the operational amplifier; and
   a tuning capacitor coupled between a second end of the second adjustable resistor and the return of the voltage source;
   wherein the voltage output from the sensorless tunable complimentary filter is available at the second end of the second adjustable resistor.

6. The SMPS according to claim 5, wherein a pole frequency of the tunable complimentary filter is adjusted to match a zero frequency of the power inductor by changing a resistance of the second adjustable resistor.

7. The SMPS according to claim 5, wherein a pole frequency of the tunable complimentary filter is adjusted to match a zero frequency of the power inductor by changing a capacitance of the tuning capacitor.

8. The SMPS according to claim 1, wherein the SMPS controller is a mixed signal integrated circuit fabricated on an integrated circuit die.

9. The SMPS according to claim 1, wherein the SMPS controller further comprises:
- an over current detection circuit having an overcurrent detected output coupled to the digital processor;
- an under and over voltage detection circuit having an under or over voltage detected output coupled to the digital processor; and
- a bias generator, and current and voltage references.

10. The SMPS according to claim 9, wherein the SMPS controller is a mixed signal integrated circuit fabricated on an integrated circuit die.

11. The SMPS according to claim 9, wherein the SMPS controller integrated circuit die is packaged in an integrated circuit package having external electrical connections.

12. The SMPS according to claim 1, further comprising an external tuning capacitor coupled to the tuning capacitor.

13. A method for optimizing operation of a switch-mode power supply (SMPS), said method comprising the steps of:
- providing at least one power switch coupled to a voltage source;
- providing a power inductor coupled to the at least one power switch;
- providing a filter capacitor coupled to a load side of the power inductor that provides a regulated voltage from the SMPS; and
- providing a SMPS controller, wherein the SMPS controller facilitates comprises the steps of:
- coupling at least one driver to the at least one power switch,
- controlling the at least one driver with a pulse width modulation (PWM) generator,
- comparing the regulated voltage from the SMPS to a reference voltage with a voltage comparison circuit,
- generating a voltage error signal representative of a difference between the regulated voltage and the reference voltage with the voltage comparison circuit,
- coupling the voltage error signal to the PWM generator,
- measuring current through the power inductor with a sensorless tunable complimentary filter coupled to the power inductor;
- providing a current output signal representative of the current flowing through the power inductor with the sensorless tunable complimentary filter,
- providing a digital processor having a memory, wherein the voltage error signal and the current output signal are coupled to inputs of the digital processor and the digital processor controls the PWM generator for adjusting operating parameters based upon the current output and voltage error signals.

14. The method according to claim 13, wherein the steps of adjusting the operating parameters further comprises the step of optimizing operation of the SMPS for all operating conditions thereof.

15. The method according to claim 13, further comprising the step of adjusting a pole frequency of the tunable complimentary filter while measuring current through the power inductor.

16. A method for optimizing operation of a switch-mode power supply (SMPS), said method comprising the steps of:
- providing a first power switch coupled to a voltage source;
- providing a second power switch coupled between the first power switch and a voltage source return;
- providing a power inductor coupled to the first and second power switches;
- providing a filter capacitor coupled to a load side of the power inductor that provides a regulated voltage from the SMPS; and
- providing a SMPS controller, wherein the SMPS controller comprises the steps of:
- driving the first power switch with a first driver,
- driving the second power switch with a second driver,
- controlling the first and second drivers with first and second pulse width modulation (PWM) signals, respectively, from a PWM generator,
- comparing the regulated voltage from the SMPS to a reference voltage with a voltage comparison circuit,
- generating a voltage error signal representative of a difference between the regulated voltage and the reference voltage with the voltage comparison circuit,
- coupling the voltage error signal to the PWM generator,
- measuring current through the power inductor with a sensorless tunable complimentary filter coupled to the power inductor;
- providing a current output signal representative of the current flowing through the power inductor with the sensorless tunable complimentary filter,
- providing a digital processor having a memory, wherein the voltage error signal and the current output signal are coupled to inputs of the digital processor and the digital processor controls the PWM generator for adjusting operating parameters based upon the current output and voltage error signals.

17. The method according to claim 16, wherein the operating parameters of the PWM generator are selected from any one or more of the group consisting of percent on times of the pulses of the first and second PWM signals, drive currents to the first and second power switches, off times between on times of the first and second power switches, and PWM pulse rate per second (frequency).

\* \* \* \* \*